United States Patent

[11] 3,598,490

[72] Inventor Gerald Anthony Yearsley
Dallas, Tex.
[21] Appl. No. 770,261
[22] Filed Oct. 24, 1968
[45] Patented Aug. 10, 1971
[73] Assignee Texas Instruments Incorporated
Dallas, Tex.

[54] HIGH-SPEED SYMBOLIZATION OF SEMICONDUCTOR ARTICLES
11 Claims, 5 Drawing Figs.

[52] U.S. Cl. .......... 355/77, 40/310, 250/65.1, 355/27, 355/39, 355/40
[51] Int. Cl. .......... G03b 27/32
[50] Field of Search .......... 355/77, 47, 27, 52, 39, 40; 353/69, 104, 106, 117, 122; 40/310

[56] References Cited
UNITED STATES PATENTS

| | | | |
|---|---|---|---|
| 1,095,313 | 5/1914 | Davids | 40/310 X |
| 3,135,621 | 6/1964 | Damm | 250/65.1 X |
| 3,264,961 | 8/1966 | Tuttle | 355/27 X |
| 3,301,128 | 1/1967 | Brandt | 353/69 |
| 3,392,501 | 7/1968 | Gilchrist | 250/65.1 X |

*Primary Examiner*—Samuel S. Matthews
*Assistant Examiner*—Monroe H. Hayes
*Attorneys*—Samuel M. Mims, Jr., James O. Dixon, Andrew M. Hassell, Harold Levine, John E. Vandigriff, Gerald B. Epstein, Melvin Sharp and Richards, Harris and Hubbard

ABSTRACT: Tests are conducted on preselected characteristics of semiconductor components. A layer of film is applied to each semiconductor component, the film adapted to exhibit variations in optical transmissivity upon the application of radiant energy. In response to the test results, an image of the desired symbolization is projected upon the layer of film in order to expose the film. Heat or high intensity light is then applied to the exposed film to develop the film and provide the desired symbolization on the semiconductor component.

Figure 1:
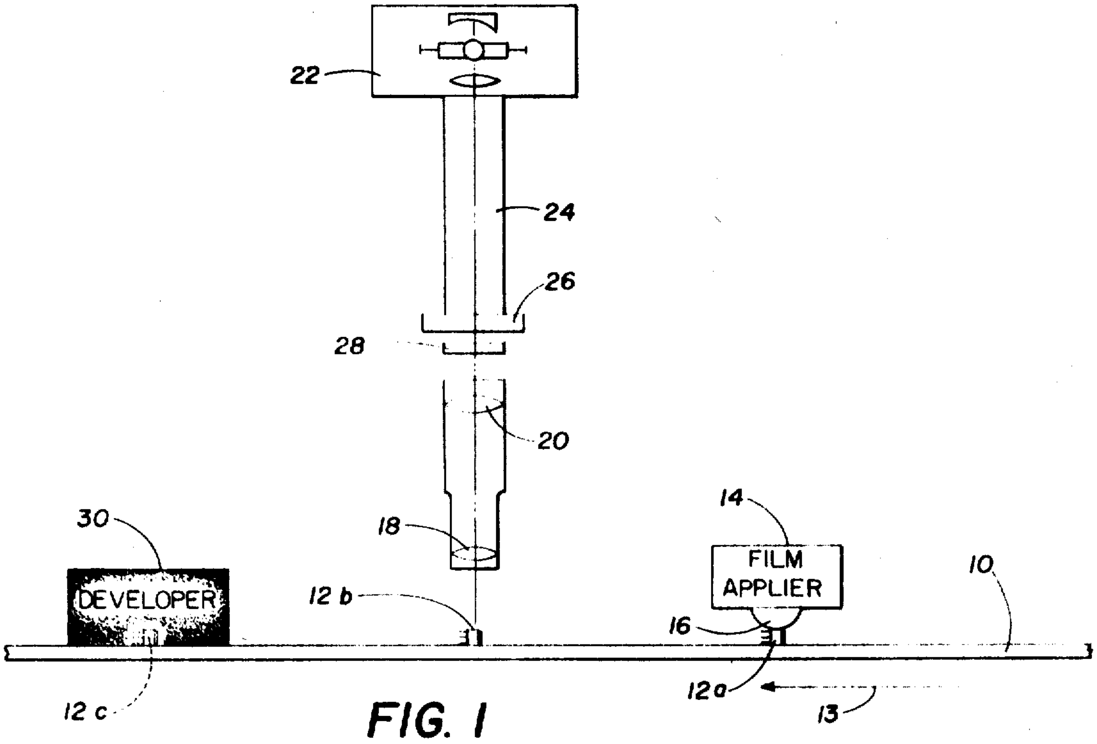

INVENTOR
GERALD A. YEARSLEY

ATTORNEY

INVENTOR
GERALD A. YEARSLEY
Jerry W. Mills
ATTORNEY

HIGH-SPEED SYMBOLIZATION OF SEMICONDUCTOR ARTICLES

This invention relates to the application of symbols to articles, and more particularly to the symbolization of semiconductor components according to characteristics of the components.

In the manufacture of electrical components such as resistors and capacitors, the finished components are tested for quality and colored dots are applied to the components which are indicative of the results of the testing. The application of such colored dots is relatively simple and inexpensive, but during the manufacture of more sophisticated components, such as transistors and the like, more detailed symbolization utilizing letters, numbers and symbols is required.

Transistors and other electronic components requiring detailed symbolization have generally heretofore been symbolized by some form of offset printing. Such printing utilizes a raised-type block which is periodically inked by a roller or the like. After inking, the type is pressed into a rubber pad to thereby transfer the image of the raised-type block onto the rubber pad in wet ink. The rubber pad is moved adjacent the electronic component to by symbolized and then pressed into contact therewith. The ink is transferred onto the electronic component in the shape of the original raised-type configuration and is then allowed to dry.

Problems have arisen in the use of such offset printing systems when high-speed symbolization is required for a large number of electronic devices of various types, as most offset printers are capable of only printing one symbolization configuration at a time. Thus, for offset printers to be practically utilized, the electronic components have to first be tested and then batched according to the tests. One batch at a time is then passed through the offset printer, with each electronic component in a batch getting the identical symbolization. After each batch has been symbolized, the type block is changed on the offset printer and a new batch of electrical components are run through the printer. In addition, the production rates of such offset printing is much slower than the present day capability of electronic component testing machines. For instance, some testing machines are capable of running at speeds of up to 10, 000 electronic components per hour, while an average offset printer may be able to symbolize only about 1,000 electronic components per hour.

In accordance with the present invention, a symbolization technique is provided which does not require electronic components to be batched before symbolization, and which may operate at speeds approximating the output rate of conventional testing machines. In operation of the technique, components are supplied with a layer of film which exhibits variations in optical transmissivity upon the application of radiant energy. An image of the desired symbolization is projected to expose the layer of film, and the exposed layer of film is then developed to provide the desired symbolization.

In a specific aspect of the invention, a film is applied to electronic components, the film exhibiting variations in optical transmissivity upon exposure to ultraviolet light. An image of ultraviolet light is then projected upon the film in accordance with the results of a testing step. Heat is then applied to the exposed film to develop the desired symbolization.

Figure 2:
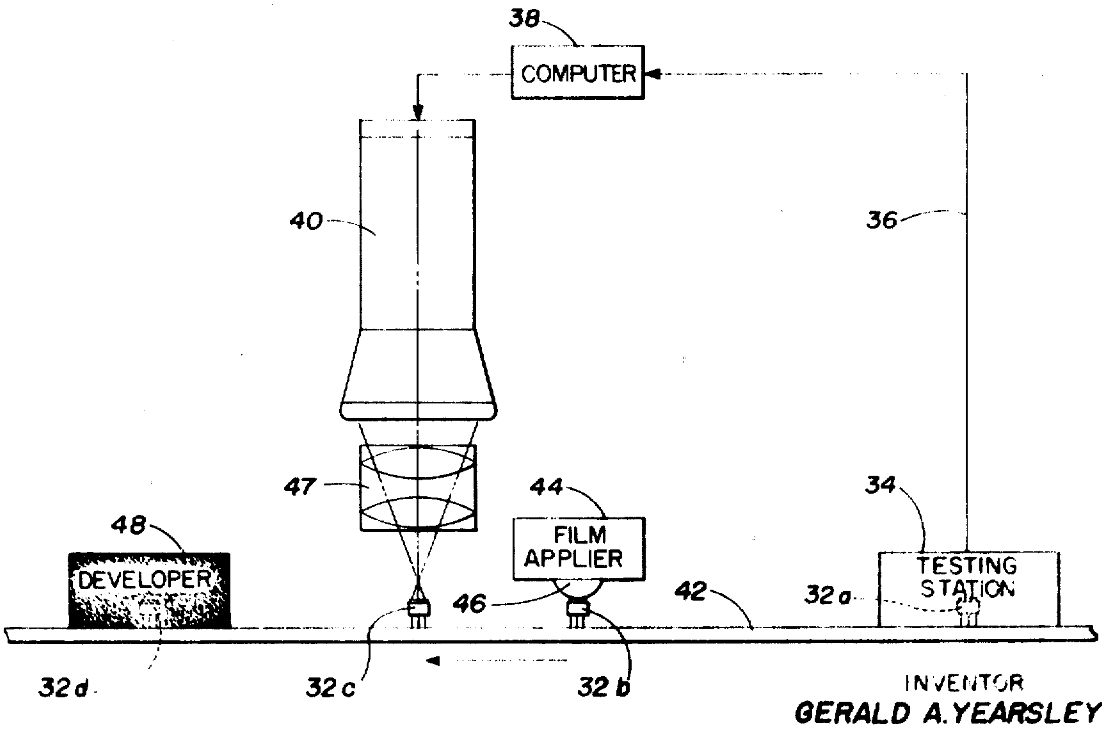
Figures 3, 4:
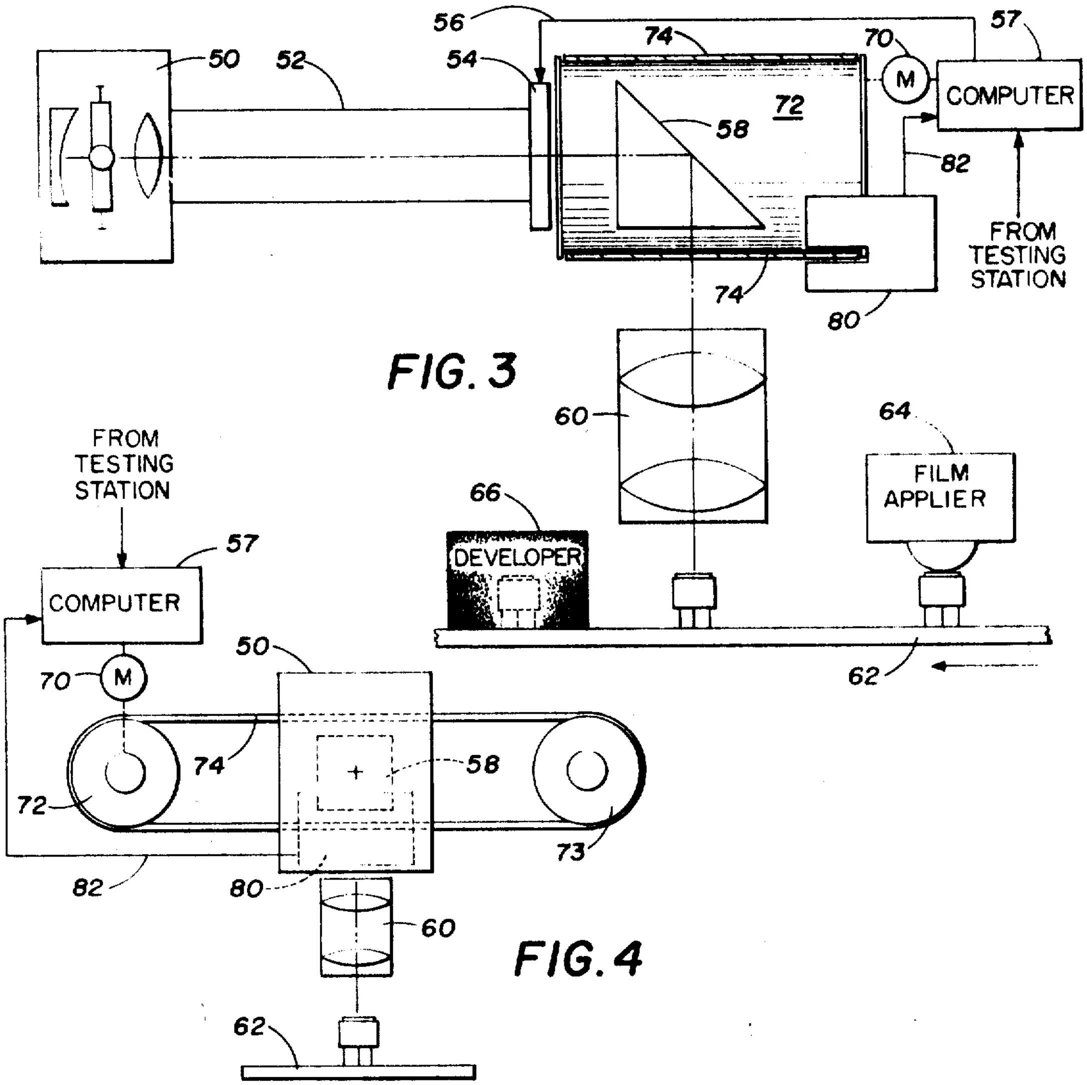
Figure 5:
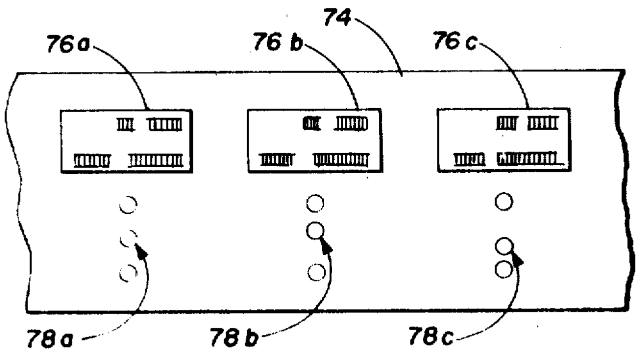

For a more complete understanding of the present invention and for further objects and advantages thereof, reference may now be had to the following description taken in conjunction with the following drawings, in which:

FIG. 1 diagrammatically illustrates one embodiment of the invention;

FIG. 2 illustrates another embodiment of the invention;

FIGS. 3 and 4 diagrammatically illustrate another embodiment of the invention utilizing a moveable tape transport;

FIG. 5 illustrates a portion of the tape transport utilized in the system shown in the FIGS. 3 and 4.

FIG. 1 illustrates an embodiment of the invention wherein a conveyor belt 10 sequentially carries a plurality of semiconductor components 12 in the direction of the arrow 13 from a suitable testing station, not shown, to the present symbolization system. The semiconductor components first travel past a position 12*a* beneath a film applier station 14 wherein a roller 16 applies a suitable layer of film to the components. A brush being supplied with liquid film substance could also be advantageously utilized at film applier station 14. The film applied to the components exhibits variations in optical transmissivity upon exposure to radiant energy. In the preferred embodiment, the layer of film applied at station 14 is responsive to ultraviolet rays to provide a darkened image thereon. The use of such film eliminates the necessity for a dark room environment about the symbolization system.

The semiconductor components are then carried by the conveyor belt 10 to a position 12*b* beneath a pair of collimating lenses 18 and 20. An ultraviolet beam is produced by a mercury vapor lamp 22. The beam travels through a tube 24 and is periodically emitted from a shutter 26. The operation of the shutter 26 is synchronized with the movement of the conveyor belt 10 in order to provide a beam of ultraviolet light when the transistor 12 is directly beneath the collimating lenses 18 and 20. The ultraviolet beam passes through a film negative, or mask, 28 which passes only portions of the ultraviolet beam to provide an ultraviolet image of the desired symbolization through the collimating lenses 18 and 20 upon the semiconductor components. The interval during which the shutter 26 is opened, and the intensity of the lamp 22, will be determined by the particular characteristics of the layer of film applied to the semiconductor components.

After the film on the semiconductor components has been properly exposed by radiant energy, the semiconductor components are carried by the conveyor belt 10 to a position 12*c* within a developing station 30. In the preferred embodiment of the invention, the developing station 30 comprises a source of heat which develops the exposed layer of film to fix the desired symbolization on the surface of the semiconductor components. Any suitable type of conventional heating method may be utilized by the invention, such as heat supplied by resistance coils, jets of hot air or the like.

Any one of a number of well-known films which tend to permanently change optical transmissivity characteristics upon exposure to radiant energy may be used with the invention. In particular, phototropic film which forms a latent image upon exposure to ultraviolet light and which may then by permanently developed by the application of heat may be advantageously utilized. A specific film which has been found to work well in practice is the phototropic film known as Kalvar film manufactured and sold by the Kalvar Corporation and described in U.S. Pat. Nos. 2,911,299 and 2,976,154.

In such Kalvar film, the latent image comprises bubble nucleation centers which expand to form bubbles upon the application of heat. These bubbles are of a different index at refraction than that of the film. The collection of such bubbles scatters incident light and gives rise to a semiopaque area effectively of a different optical transmissivity than the remainder of the film.

In particular, Kalvar film types 10 and 80 may be effectively utilized with the invention. Kalvar film type 10 may be exposed in approximately 100 milliseconds by ultraviolet light emitted by a 200 watt mercury vapor lamp. The film may then be developed by the application of a temperature in the range of 240° F. for approximately 1 second. Kalvar film type 80 is also exposed by ultraviolet light, but is developed by the application of high intensity light instead of the application of heat. Specifically, an energy source such as a 200 watt per second Xenon flash lamp may be used to permanently develop Kalvar film type 80.

The system shown in FIG. 1 is primarily advantageous when a plurality of components of one batch type are available for symbolization. However, as previously noted, it is often desirable to sequentially symbolize components of different types as determined by tests of electrical characteristics of the components. FIG. 2 illustrates a system which may symbolize any one of a number of different types of semiconductor devices. The semiconductor devices are first sequentially transported to a position 32*a* where they are tested at a testing station 34. Station 34 comprises a conventional probing system wherein electrical characteristics of the semiconductor devices are tested. In the case of transistors, for instance, tests are performed to determine such characteristics as the leakage current, the collector voltage and current, the transistor gain, heat dissipation and the like. The results from the various testing steps are fed via a lead 36 to a computing system 38, wherein the testing results are compared against predetermined criteria in order to determine the batch number of the device being tested.

The output from the computing system 38 is fed to the input of a cathode ray tube 40. The output from the computer 38 builds a display on the cathode ray tube 40 representative of a symbolization image applicable to the component tested at the testing station 34. The face of the cathode ray tube 40 is preferably coated with phosphor to emit ultraviolet rays for proper exposure of the film applied to the components. A suitable cathode ray tube for use with the present system is the CRT utilized in the Model 340 cathode ray tube display console manufactured and sold by Digital Equipment Corporation. Another suitable cathode ray tube is the C5A16C High Resolution Flying Spot Scanner Tube manufactured and sold by Litton Industries under the trade name MICROPIX.

After the components have been tested at station 34, they are moved by a conveyor belt 42 to a position 32*b* beneath a film applier 44. The film applier 44 includes a roller 46 which supplies a uniform layer of ultraviolet responsive film to the components.

After the application of the layer of film, the components are moved to position 32*c*, whereupon the layer of film is exposed by the ultraviolet image transmitted from the cathode ray tube 40 and collimated by a lens system 47. As previously noted, the scan of the cathode ray tube 40 is controlled by the output of computer 38 to provide the desired symbolization image according to the results of the tests run at the testing station 34. For some instances, a fiber optics faceplate may be attached to the cathode ray tube 40 in order to more precisely dispose the image upon the components.

After the layers of film have been exposed to ultraviolet light, the conveyor belt 42 transports the components to a position 32*d* within a developer station 48. The layers of film are developed at station 48 by the application of heat, or by high intensity light, depending upon the type of film utilized. After development of the films, the symbolized components are transported by the conveyor belt 52 to packaging station.

FIGS. 3—5 illustrate another embodiment of the symbolization system. Ultraviolet light is emitted by a mercury vapor light 50 and is transmitted through a tube 52 to a shutter 54. The shutter 54 is operated in synchronism with the movement of components by signals fed via a lead 56 from a computer 57. Ultraviolet light emitted from the shutter 54 is deflected by a prism 58 downwardly through a collimating lens system 60 for impingement upon an electronic component. A plurality of components are sequentially transported by a conveyor belt 62. A layer of film is applied to each of the components at a film application station 64. The conveyor belt 62 then carries the transistors to a point beneath the collimating lens system 60, whereupon the film is exposed by application of ultraviolet light. The components are then carried by the conveyor belt 62 to a developer station 66, where the exposed layer of film is suitably developed as previously disclosed.

Before the application of film to the components, electrical characteristics of the components are tested at a testing station, not shown, and the test results are applied to the input of the computer 57. In response to the signals from the testing station, the computer 57 operates a motor 70 to drive a roller 72. A roller 73 is spaced from roller 72 for support of a continuous film loop 74.

As shown in FIG. 5, the continuous tape 74 includes a number of image negatives, or masks, 76*a*—*c*, each of the negatives being representative of a different symbolization configuration. Sets of coded apertures 78*a*—*n* are defined through the film 74 adjacent each negative 76, with each set of apertures having a different configuration. These coded apertures are sensed by a code reader 80. Code reader 80 comprises, for instance, a source of light and a light sensitive tube which senses the light transmitted through the coded apertures 78*a*—*n*. Logic circuitry is responsive to the output of the light sensitive tube to generate a signal indicative of which one of the symbolization negatives 76*a*—*n* is presently disposed between the prism 58 and the collimating lens 60. This indication is fed to the computer 57 via a lead 82.

In operation of the system shown in FIGS. 3—5, a component such as a transistor is tested for preselected electrical characteristics. The characteristics are fed to the computer 57, and are compared with stored criteria. In accordance with the comparison, an indication of the quality and the batch number of the transistor is generated by the computer 57. The motor 70 is operated to rotate roller 72 to thereby move the film 74 until an indication is provided by the code reader 80 that the correct symbolization negative 76 is positioned between the prism 58 and the collimating lens system 60. The correct symbolization negative contains the desired quality and batch information. When the correct negative position has been reached, the computer 58 stops motor 70 and operates the shutter 54. Ultraviolet light is transmitted through the negative 76 and through the collimating lens system 60 for impingement upon the transistor disposed therebelow. The ultraviolet image exposes the layer of film upon the transistor. The transistor is then moved by the conveyor belt 62 to the developer station 66, whereupon the proper symbolization is developed.

Although the embodiments of the invention have been illustrated with the layer of film being applied after the testing step, it will be understood that the layer of film count be applied at any time during the manufacture of the articles. For instance, in the manufacture of electronic components having metal casings, the film could be applied to the metal casings before final assembly of the components. In the manufacture of plastic electronic components, the film could be applied to the components almost immediately after the formation of the plastic body.

Whereas various embodiments of the present invention have been described in detail, it will be understood that various changes and modifications will be suggested to one skilled in the art, and it is intended to encompass such changes and modifications as fall within the true scope of the appended claims.

I claim:

1. A method of symbolizing electronic components comprising:

a. testing preselected electrical characteristics of the electronic components;

b. determining the applicable symbolization for said electronic components from the results of the testing;

c. applying to said electronic components a layer of film which exhibits variations in optical transmissivity upon the application of radiant energy;

d. projecting an image of the applicable symbolization upon said layer of film; and e. developing said layer of film to provide the desired symbolization upon said electronic components.

2. The method of claim 1, wherein said film darkens upon exposure to ultraviolet light, said image formed by projecting a beam of ultraviolet light through a mask having apertures defining the desired symbolization.

3. The method of claim 1 wherein said step of developing comprises:

heating said layer of film to a sufficient temperature to develop said film.

4. A system for symbolizing electronic components comprising:

a. means for testing preselected electrical characteristics of the electronic components;

b. means for determining the applicable symbolization for said electronic components from the results of the testing;

c. means for applying to said electronic components a layer of film which exhibits variations in optical transmissivity upon the application of radiant energy;

d. means for projecting an image of the applicable symbolization upon said layer of film; and e. means for developing said layer of film to provide the desired symbolization upon said electronic components.

5. The system of claim 4 wherein said film is of the phototropic type and darkens upon exposure to ultraviolet light.

6. The system of claim 4 wherein said means for developing comprises:

means for heating said film layers to a temperature above ambient temperature.

7. The system of claim 4 wherein said means for projecting an image comprises:

a cathode ray tube for projecting a beam of actinic light.

8. The system of claim 4 wherein said means for projecting an image includes:

means for projecting a beam of ultraviolet light toward said electronic components; and mask means defining the desired symbolization disposed between said beam and said electronic components.

9. The system of claim 8 and further comprising:

a film transport having a plurality of masks defined therein, and means for moving said film in accordance with said characteristics of said electronic components.

10. The system of claim 9 wherein said film transport comprises:

a continuous loop of film rotatable about two spaced apart rollers.

11. The system of claim 10 and further comprising:

shutter means for selectively blocking said beam of ultraviolet light.